United States Patent
Lindt

(10) Patent No.: US 7,167,936 B2
(45) Date of Patent: Jan. 23, 2007

(54) CIRCUIT BOARD HAVING AN INTEGRATED CIRCUIT FOR HIGH-SPEED DATA PROCESSING

(75) Inventor: Paul Lindt, Donauworth (DE)

(73) Assignee: Infineon Technologies AG, Munich (DE)

(*) Notice: Subject to any disclaimer, the term of this patent is extended or adjusted under 35 U.S.C. 154(b) by 616 days.

(21) Appl. No.: 10/348,421

(22) Filed: Jan. 21, 2003

(65) Prior Publication Data
US 2003/0147222 A1 Aug. 7, 2003

(30) Foreign Application Priority Data
Jan. 25, 2002 (DE) .............................. 102 02 878

(51) Int. Cl.
G06F 3/00 (2006.01)
H01P 3/00 (2006.01)
H01P 3/08 (2006.01)
G11C 5/02 (2006.01)
H01L 21/44 (2006.01)

(52) U.S. Cl. .......................... 710/71; 710/58; 365/51; 438/106; 333/236; 333/246

(58) Field of Classification Search ............... 710/71; 333/236, 246; 365/51; 438/106; 455/214; 326/93
See application file for complete search history.

(56) References Cited

U.S. PATENT DOCUMENTS

| 3,949,277 A | * | 4/1976 | Yosset .......................... 361/686 |
| 4,868,634 A | | 9/1989 | Ishida et al. |
| 5,880,987 A | * | 3/1999 | Merritt .......................... 365/51 |
| 6,118,670 A | | 9/2000 | Radford et al. |
| 6,353,549 B1 | * | 3/2002 | Merritt .......................... 365/51 |

FOREIGN PATENT DOCUMENTS

DE 19517967 A1 11/1996

* cited by examiner

Primary Examiner—Tammara Peyton
Assistant Examiner—Alan S. Chen
(74) Attorney, Agent, or Firm—Jenkins, Wilson, Taylor & Hunt, P.A.

(57) ABSTRACT

Circuit board having a plurality of bus lines (6), which run on the circuit board (1) essentially parallel to a preferred direction of the circuit board (1), and having at least one integrated circuit (3) for the high-speed data processing of data, which integrated circuit is arranged on the circuit board (1), is integrated in a housing (4) having a plurality of housing sides (5) and has a plurality of parallel interfaces for connection to the bus lines (6), in which case the housing sides (5) of the integrated circuits (3) are oriented at an inclination with respect to the preferred direction of the circuit board (2).

4 Claims, 5 Drawing Sheets

CIRCUIT BOARD HAVING AN INTEGRATED CIRCUIT FOR HIGH-SPEED DATA PROCESSING

TECHNICAL FIELD

The invention relates to a circuit board having at least one integrated circuit for high-speed data processing positioned thereon according to the preamble of Patent claim 1.

BACKGROUND ART

FIG. 1 shows a line card or a circuit board according to the prior art for incorporation into a switchgear cabinet. The line card is rectangular and has a plurality of edges. In this case, a plug for plugging the line card into the switchgear cabinet is provided at the rear side of the line card, the line card being able to be connected to an internal bus of the switch-gear cabinet via the plug.

An integrated circuit for high-speed data processing is provided on the circuit board and, in the example shown, is connected to the plug via the input side via two parallel buses A, B. The buses A, B each comprise a plurality of bus lines running parallel. The integrated circuit carries out a data processing of the incoming data and outputs then, in the example illustrated in FIG. 1, via two buses C, D in each case to parallel-serial converters connected downstream. The parallel-serial converters carry out a parallel-serial conversion of the data present in parallel on the bus lines. The parallel-serial converters output a serial data stream via serial data outputs A via connected lines. By way of example, the data arriving from the bus A are processed on the integrated circuit and the data are then applied via the bus C to the parallel-serial converter connected downstream. The latter then outputs a serial data stream via the output port A.

FIG. 2 shows the arrangement of the bus lines in the case of a conventional circuit board according to the prior art. The bus lines are arranged in a preferred direction proceeding from the plug toward the end side of the line card within the switchgear cabinet. The integrated circuit of the data processing is arranged in a housing having a plurality of sides. In the case of the example illustrated in FIG. 2, the housing has four sides, a parallel interface being provided at each side of the housing. Each of said parallel interfaces comprises a plurality of data inputs and outputs. In the case of the example illustrated in FIG. 2, the high-speed IC has four parallel interfaces each arranged at a side of the housing. The parallel interfaces serve for connecting the integrated circuit to the bus lines for the data exchange. Many applications require data transmission rates in the GHz range, i.e. the data are transmitted via the data bus with a data transmission speed of a few gigabits per second. Electrical signals on printed circuit boards or circuit boards propagate more slowly than light. The speed of light of 300 000 km per second applies to a propagation of the light in a vacuum or to an approximation also in air. The actual propagation speed of an electrical signal is proportional to the root of the relative electrical constant Er. If the relative electrical constant is Er=10, for example, the propagation speed of the electrical signal is about 100 000 km per second. The electrical signals propagate on a circuit board in the lines with a finite propagation speed which depends greatly on the printed circuit board material. The second influencing factor for the signal propagation time is the length of the conductor tracks. The longer the conductor track to which the high-frequency signal is applied, the longer the time required by the signal to pass from a transmitting device to a receiving device. If a plurality of signals are transmitted simultaneously, for example via a data bus, then the signals will arrive at the receiving device at different points in time in the case where the data bus lines have different line lengths. During a time duration of 400 picoseconds, which corresponds to the data bit duration of a data transmission signal with a data transmission rate of 2.5 gigabits per second, the distance covered by the data signal at a propagation speed of 100 000 km per second is about 4 cm. Given a line length on the circuit board of 10–20 cm, for example, a plurality of data bits are simultaneously situated on a data transmission line, and propagate on the data transmission conductor track. Given data transmission rates of 2–3 gigabits per conductor track, for example, the different conductor track length can therefore bring about propagation time differences which are of the order of magnitude of the data bit duration of a transmitted data bit. This can have the effect that data transmitted in parallel via different conductor tracks of a data bus are shifted relative to one another.

FIG. 2 shows a receiving stage of an integrated circuit according to the prior art. As can be discerned from FIG. 2, ideally all the input data present on the data bus lines are accepted by the integrated circuit with a single clock signal for data processing, said clock signal being generated by a clock generator. If all the data transmission lines have the same length, only one signal delay occurs on the respective conductor track. In this case, said signal delay is of the same magnitude for all the data transmission lines. In this case, all the data transmission signals are received by the integrated circuit exactly as they were transmitted by a transmitting device. However, if there are considerable differences in the line length of the different data transmission lines, then data transmission bits belonging to different clock cycles are accepted at the inputs of the receiving stage. Compensation of the propagation time differences by taking them into account during the data processing is only possible if the propagation time differences of the different conductor tracks are known fully during the production of the integrated circuit. Moreover, a compensation is always associated with a considerable additional outlay on circuitry within the integrated circuit.

The problem brought about by the different signal propagation times is aggravated the more signals are transmitted in parallel via a bus, particularly when signals have to be applied to different housing sides of the integrated circuit, as is illustrated in FIG. 3. In the case of the arrangement illustrated in FIG. 3, drastic propagation time differences arise between the lines of the bus B, but also between the buses A and B. A simple read-in of the data present in parallel by the integrated circuit IC is eventually impossible in this case.

This becomes even clearer in FIG. 4. FIG. 4 shows merely four data lines, for simplification, namely three data lines of the data bus B and one data line of the data bus A. Since the propagation time of a transmitted data signal is directly proportional to the line length of the associated data bus line, at high data transmission rates the different line lengths of the data bus lines lead to propagation time differences which are of the order of magnitude of or greater than the time duration of a transmitted data bit. By way of example, a signal of 2.5 gigabit per second has a bit duration of 400 picoseconds. Given an assumed propagation speed of approximately 10 cm/ns, a data information bit propagates by approximately 4 cm within its bit duration. If there are different line lengths, then the individual bits reach different widths of the integrated circuit. Such propagation time differences lead to data values read in incorrectly by the integrated circuit and thus to an erroneous data processing.

In order to compensate for such propagation time difference, therefore, meander-shaped arcs have previously been inserted into the data transmission lines so as to compensate for the propagation time differences. In this case, the longest signal line in the layout determines the required propagation time compensation. The shorter the data signal line in the layout, the higher the number of meander-shaped arcs inserted for increasing the data line length. The increased data line length effects compensation of the propagation time difference with respect to the longer data signal lines. As shown in the example of FIG. 4, the meander-shaped arcs include one or more angled bends to increase the data line length for compensating for propagation time differences.

The meander-shaped course of the data signal lines leads to a considerably more complex layout of the data bus lines on the circuit board or the line card. The area available on the circuit board is very limited in many applications, so that the meander-shaped arc can be accommodated on said area only with great difficulty or not at all. Furthermore, the meander-shaped arcs lead to undesired inductances, in particular at very high data transmission rates.

SUMMARY OF THE INVENTION

Therefore, the object of the present invention is to provide a circuit board having at least one integrated circuit for high-speed data processing arranged thereon, in the case of which the propagation time differences between input and output signals of the integrated circuit are minimal.

The object is achieved according to the invention by means of an integrated circuit having the features specified in patent claim 1.

In a preferred embodiment of the circuit board according to the invention, the housing sides of the circuits integrated thereon are oriented at an inclination at an angle of 45° and with respect to the preferred direction of the circuit board.

In a particularly preferred embodiment of the circuit board according to the invention, the bus lines are designed for transmitting data with a data transmission rate of at least one gigabit per second.

The propagation time differences between the bus lines preferably have at least the duration of a data bit of the transmitted data signal.

In a particularly preferred embodiment of the circuit board according to the invention, the bus lines additionally have meander-shaped arcs for compensating for propagation time differences.

Advantageous refinements of the integrated circuit according to the invention are described below with reference to the accompanying figures for explaining features that are essential to the invention.

DETAILED DESCRIPTION OF THE INVENTION

Figure 5:
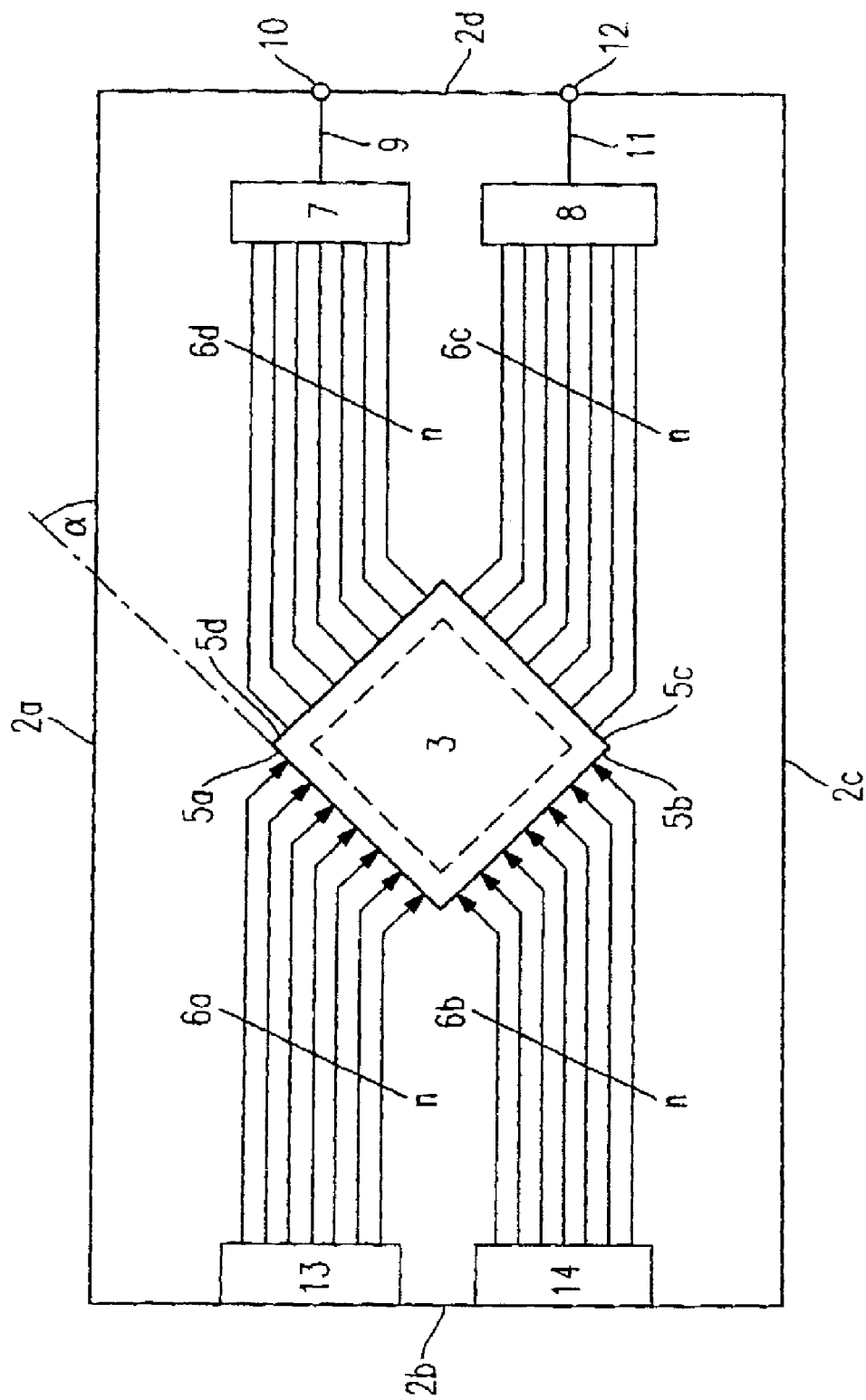
FIG. 5 shows an arrangement of an integrated circuit on a circuit board according to the invention.

FIG. 5 shows the arrangement of an integrated circuit according to the invention on a circuit board according to the invention.

The line card or circuit board 1 is rectangular and has four edges 2a, 2b, 2c, 2d. In addition to the integrated circuit 3 which is arranged on the line card 1 and is integrated in a housing 4, there may be further modules arranged on the line card 1. By way of example, parallel-serial converters connected to serial output ports are provided at the end side 2d of the line card.

In the case of the embodiment of the circuit board 1 according to the invention as illustrated in FIG. 5, the integrated circuit 3 positioned thereon according to the invention has integrated circuit 3 [sic], the latter has four parallel interfaces at the housing sides 5a, 5b, 5c, 5d which are in each case connected to a data bus 6a, 6b, 6c, 6d. In the case of the embodiment illustrated in FIG. 5, the data received via the data buses 6a, 6b are processed by the integrated circuit 3 with a high processing speed. The processed data are output via buses 6a, 6d to parallel-serial converters 7, 8 connected downstream. The parallel-serial converters 7, 8 each convert the processed data transmitted in parallel into a serial data stream. The serial data stream is output from the parallel-serial converter 7 via a data line 9 to a data output 10. The data stream converted by the parallel-serial converter 8 is output via a data line 11 to a data output 12 of the line card 1.

The remaining data buses 6a, 6b can be connected to a switchgear cabinet data bus via connection plugs 13, 14.

Figure 4:
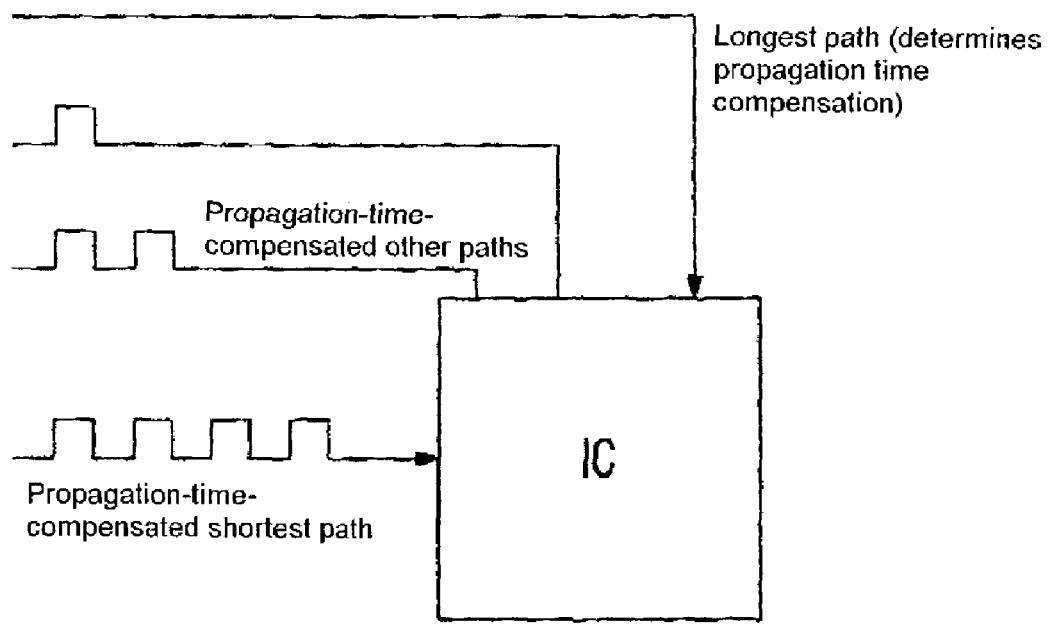
FIG. 4 shows a detailed view of the signal lines of a conventional line card for compensating for compensation time differences according to the prior art.

As can be discerned from FIG. 5, the sides 5a, 5b, 5c, 5d are oriented at an inclination with respect to the edges 2a, 2b, 2c, 2d of the circuit board 1. In the case of the, particularly preferred, embodiments illustrated in FIG. 4 [sic ], the sides of the housing 4 are oriented at an inclination at an angle of 45° with respect to the edges 2a, 2b, 2c, 2d of the circuit board 1. The different signal lines of the buses each have a bend, the bend angle amounting to 180°–45°=135°. The signal lines preferably have no meander-shaped arcs for compensating for signal propagation times. Such meander-shaped arcs may optionally be provided in addition if the intention is furthermore to minimize the propagation time differences.

Figure 1:
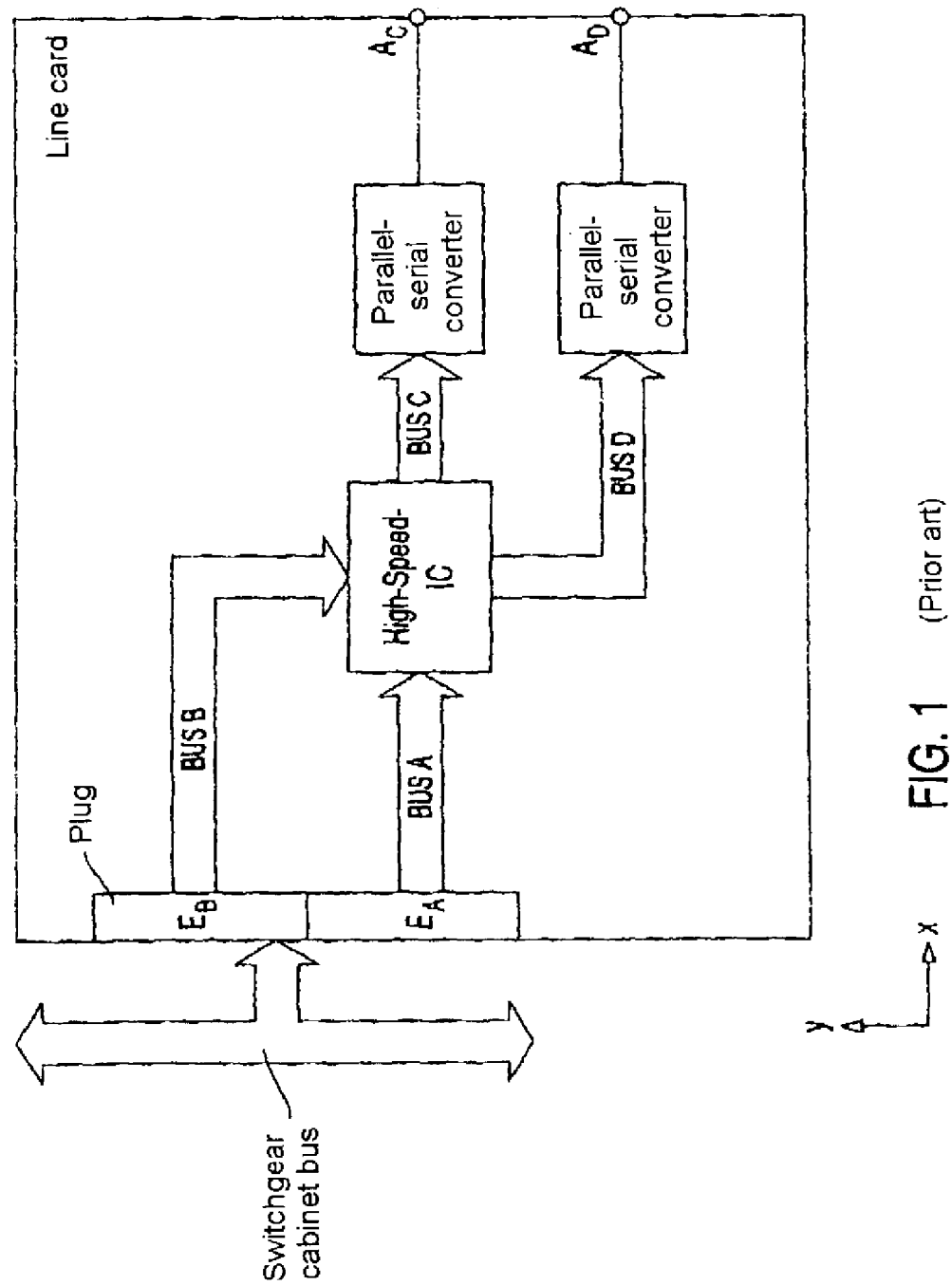
FIG. 1 shows a circuit board according to the prior art.
Figure 2:
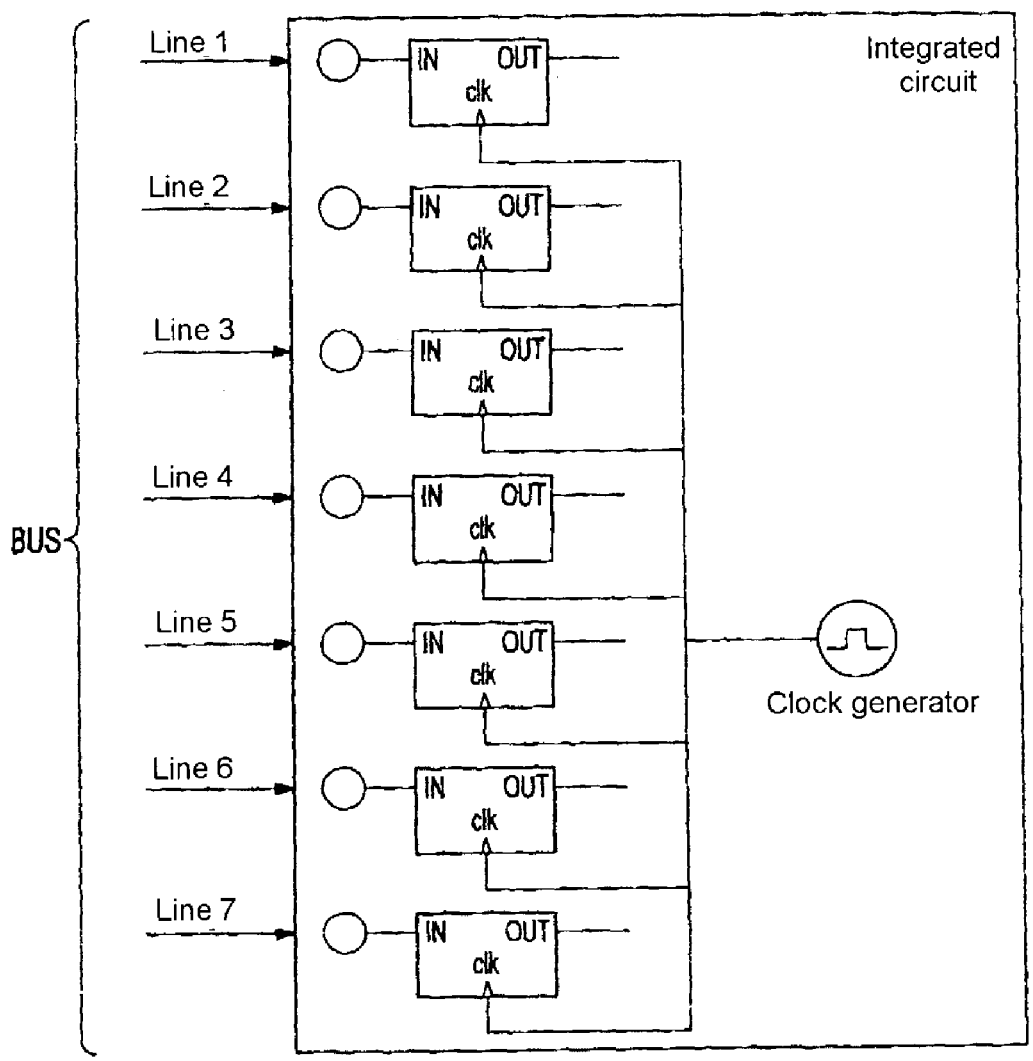
FIG. 2 shows a receiving stage of an integrated circuit according to the prior art
Figure 3:
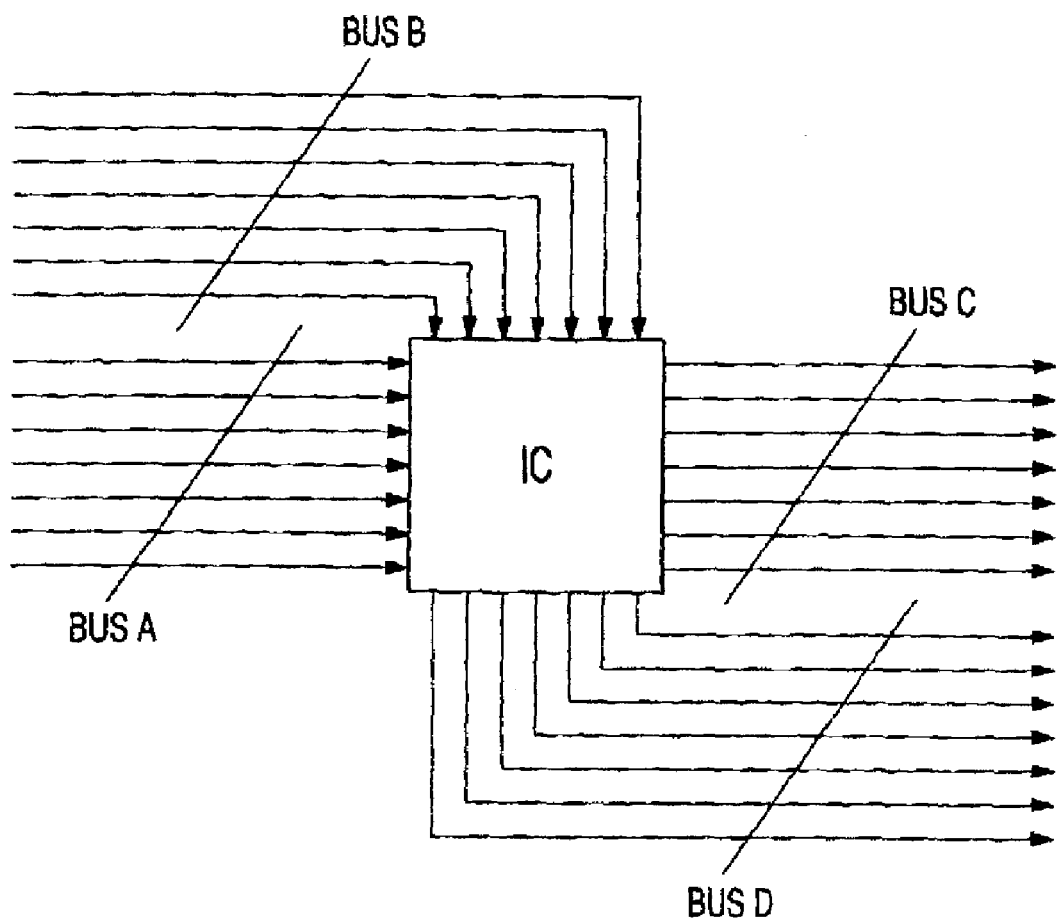
FIG. 3 shows a course of data lines in the case of the circuit board according to the prior art as illustrated in FIG. 1.

On account of the bend-shaped course of the data lines as illustrated in FIG. 5, the differences between the line lengths at the signal lines within a data bus are considerably smaller than in the case of the conventional arrangement illustrated in FIG. 2. In a particularly preferred embodiment of the integrated circuit, the residual propagation time differences can be compensated for by additional meander-shaped arcs in the data bus lines. However, the number of meander-shaped arcs required in the data bus lines is considerably smaller than the number of meander-shaped arcs in a conventional arrangement as illustrated in FIG. 2, 3. Consequently, the necessary area requirement for the data lines which lead toward the integrated circuit 3 or lead away from the integrated circuit 3 is considerably reduced as a result of the rotation of the housing 4 of the integrated circuit 3 by 45°, with regard to the edges 2 of the circuit board 1.

Moreover, the layout of the data lines on the circuit board is considerably facilitated by the rotation of the housing by 45°.

The integrated circuit arranged on the circuit board are [sic] positioned in an innovative manner on the printed circuit board material. As a result of the innovative mounting technique, the data processing in the integrated circuit is considerably simplified or made possible in the first place. The propagation time differences between the data transmission lines are minimized as a result of the inclination of the housing sides of the integrated circuits relative to a preferred direction. What is achieved by the inclination of the housing sides of the integrated circuits at an angle of 45°, with regard to a preferred direction, is that two housing sides of an integrated circuit look in the preferred direction. Although there are still small propagation time differences between the signals present, said propagation time differences are considerably reduced on average. In addition, the orientation of the integrated circuits rotated by 45° relative to the preferred direction enables a simplified configuration of the layout of the circuit board.

LIST OF REFERENCE SYMBOLS

1 Circuit board
2 Edges
3 Integrated circuit
4 Housing
5 Housing sides
6 Buses
7 Parallel-serial converter
8 Parallel-serial converter
9 Line
10 Output
11 Data line
12 Output
13 Plug connection
14 Plug connection

What is claimed is:

1. High-speed line card for a switchgear cabinet having:
(a) at least one plug for connection to the switchgear cabinet;
(b) at least one circuit for the high-speed data processing of data, which circuit is arranged on the line card and is integrated in a housing;
(c) the integrated circuit having at least one parallel interface provided at a housing side for receiving data from the plug via a bus and at least parallel interface provided at a further housing side for outputting data to a parallel/serial converter via a bus;
(d) the buses each having a plurality of bus lines running parallel to an edge of the line card for the transmission of data with a data transmission rate of more than one gigabit per second, wherein each bus line has a bend having a bend angle and the bend angle is dependent on an inclination angle of the housing sides of the integrated circuit with respect to the edge of the line card, and
(e) the housing sides of the integrated circuit, for the purpose of minimizing the propagation time differences between the data signals transmitted on the bus lines, being oriented at an inclination at a specific angle with respect to the edge of the line card.

2. Line card according to claim 1, wherein the housing sides of the circuits integrated thereon are oriented at an inclination at an angle of 45° with respect to the edge of the line card.

3. Line card according to claim 1, wherein the bus lines additionally have meander-shaped arcs including one or more angled bends for compensating for propagation time differences.

4. Line card according to claim 1, wherein the propagation time differences between the bus lines have at least the duration of a data bit of the transmitting data signal.

* * * * *